United States Patent
Alers et al.

[11] Patent Number: 5,804,975
[45] Date of Patent: Sep. 8, 1998

[54] DETECTING BREAKDOWN IN DIELECTRIC LAYERS

[75] Inventors: Glenn Baldwin Alers, Chatham; Kathleen Susan Krisch, Scotch Plains, both of N.J.; Bonnie Elaine Weir, Bronxville, N.Y.

[73] Assignee: Lucent Technologies Inc., Murray Hill, N.J.

[21] Appl. No.: 718,113

[22] Filed: Sep. 18, 1996

[51] Int. Cl.⁶ .................................................. G01R 31/26
[52] U.S. Cl. ..................... 324/613; 324/520; 324/719; 438/14; 438/10
[58] Field of Search ................. 437/8; 324/613, 324/719, 520; 438/14, 10

[56] References Cited

U.S. PATENT DOCUMENTS

| | | | |
|---|---|---|---|
| 4,891,577 | 1/1990 | Ishikawa | 324/613 |
| 5,049,811 | 9/1991 | Dreyer | 324/613 |
| 5,252,497 | 10/1993 | Idler | 324/613 |
| 5,598,102 | 1/1997 | Smayling | 324/537 |

OTHER PUBLICATIONS

K.R. Farmer et al, *Appl. Phys. Lett.*, vol. 52, No. 20, May 16, 1988, pp. 1749–1751, "Current Fluctuations . . . Tunnel Diodes".
Z.J. Ma et al, *IEEE Electron Device Letters*, vol. 15, No. 6, Jun. 1994, pp. 224–226, "Effects of Plasma . . . MOSFETs".
M. Aoki et al, *IEEE Electron Device Letters*, vol. 17, No. 3, Mar. 1996, pp. 118–120, "Hole–Induces 1/f Noise . . . Transistors".
Lee, S–H et al., "Quasi–breakdown of ultrathin gate oxide under high field stress", IEEE, Mar. 1994, pp. 25.4.1 to 25.4.4.

*Primary Examiner*—Ernest F. Karlsen
*Assistant Examiner*—Jose M. Solis

[57] ABSTRACT

The breakdown of an ultra-thin dielectric layer is detected by applying a test signal to the layer. Measurements are taken of noise signals present in the layer during the application of the test signal. At breakdown, a significant increase occurs in the amplitude of the measured noise signals.

19 Claims, 1 Drawing Sheet

DETECTING BREAKDOWN IN DIELECTRIC LAYERS

BACKGROUND OF THE INVENTION

This invention relates to dielectric layers and, more particularly, to detecting the occurrence of breakdown in such layers.

Dielectric layers constitute vital elements of a wide variety of electronic components. Thus, for example, silicon dioxide is commonly utilized to form the so-called gate oxide layer of a typical metal-oxide-semiconductor (MOS) transistor device. For some high-performance MOS devices, the thickness of the dielectric gate layers may have to be exceedingly small [for instance, only about six nanometers (nm) or less].

Fabricating ultra-thin dielectric layers that meet specified operating criteria is a challenging task. This is particularly true when a large-area dielectric layer must be formed on the entirety of the surface of a wafer or other substrate on which multiple devices are to be made in a batch-fabrication sequence. To minimize the chances that such devices will fail during actual operation, it is advantageous to measure certain characteristics of the dielectric layers of the devices either at some intermediate point in the fabrication sequence or at least before shipping the devices to a customer.

Determining the point at which a dielectric layer breaks down or determining the fraction of devices whose dielectric layers show early breakdown are important ways of assessing the quality of the layer. An actual device or wafer (or a test device or wafer) whose dielectric layer fails to exhibit a prespecified breakdown characteristic would, of course, be rejected for use or utilized as a basis for modifying the fabrication sequence.

As a specific illustrative example, for relatively thick dielectric gate layers (thicker than say about six nm), the breakdown characteristic can usually be adequately measured by any one of a number of standard techniques. Thus, for instance, a voltage applied across such a layer can be periodically ramped up to successively higher values while measuring current flow through the layer. At breakdown, a substantial increase in current flow occurs. In another standard technique, the current through the layer is regularly increased while measuring the voltage across the layer. At breakdown, a substantial decrease occurs in the voltage across the layer. In yet other approaches, either a constant current or a constant voltage is maintained through or across the layer until and subsequent to breakdown. At breakdown, either the voltage decreases (for the constant-current case) or the current increases (for the constant-voltage case). In another early-breakdown screening technique, a voltage higher than some specified operating value is momentarily applied across the layer and the current therethrough is measured. If the current does not exceed a prespecified value, the layer is determined to have not suffered breakdown.

For all of the aforementioned standard testing techniques, distinguishing between the pre-breakdown and breakdown states of a dielectric layer becomes increasingly difficult as the layer gets thinner. Thus, for example, for a silicon oxide layer thinner than about six nm, the absolute value of the current through or the voltage across the layer at breakdown may not be statistically different from the corresponding quantity that is measured before breakdown. In such cases, a reliable determination of the breakdown characteristic of the layer being tested is very difficult or even impossible.

Accordingly, continuing efforts have been directed by workers skilled in the art aimed at trying to devise other ways of measuring breakdown in very thin dielectric layers. It was recognized that such efforts, if successful, would make possible, or at least facilitate, accurate testing of such layers to detect the occurrence of breakdown therein. In turn, this would provide, for example, a basis for insuring that the breakdown characteristics of very thin dielectric layers included in high-performance devices could be reliably tested. As a result, the manufacturing yield, cost and long-term operating properties of the devices could thereby be significantly improved.

SUMMARY OF THE INVENTION

In accordance with the principles of the present invention, current or voltage fluctuations (noise signals) that occur in a dielectric layer in response to applied test signals are utilized as a basis for determining the breakdown status of the layer. At breakdown, especially in ultra-thin layers, a significant increase occurs in the magnitude of the measured noise signals.

BRIEF DESCRIPTION OF THE DRAWINGS

A complete understanding of the present invention and of the above and other features and advantages thereof may be gained from a consideration of the following detailed description presented hereinbelow in connection with the accompanying drawing, not drawn to scale, in which.

DETAILED DESCRIPTION

Herein, for purposes of a specific illustrative example, the dielectric layer to be tested will be assumed to be a conventional layer made of thermally grown silicon dioxide which constitutes the gate oxide of a standard MOS device. It is well known that the long-term reliability of such a device is critically dependent on the gate oxide layer thereof exhibiting a breakdown characteristic that meets some prespecified standard.

Figure 1:
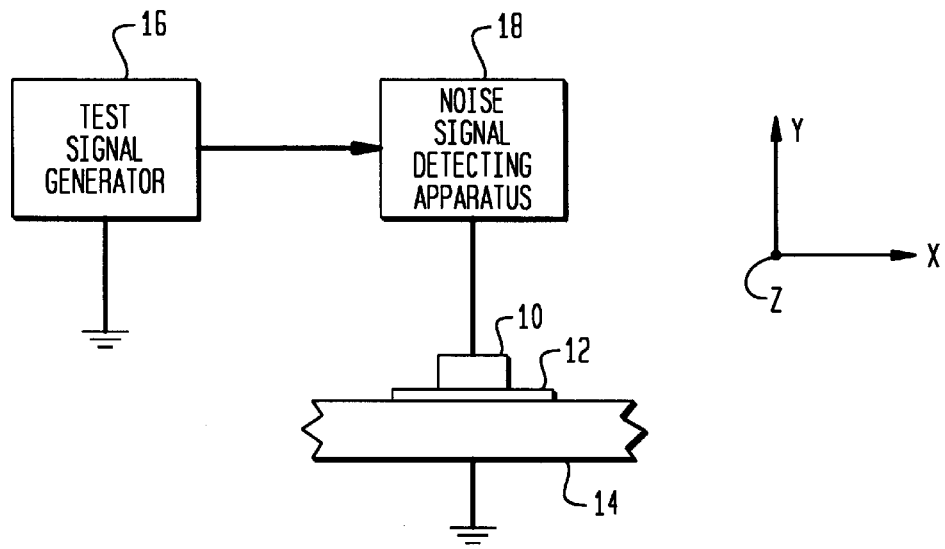
FIG. 1 is a simplified depiction of apparatus that is adapted to test a dielectric layer for breakdown in accordance with the principles of the present invention.

By way of a particular example, FIG. 1 shows a conventional gate electrode 10 that has been formed on a dielectric gate layer 12 in accordance with standard integrated-circuit fabrication techniques. Herein, the layer 12 will be assumed, for illustrative purposes, to be a dielectric layer having a Y-direction thickness of about three nm in turn, the layer 12 is shown formed on a portion of the top surface of a conventional silicon wafer 14.

In practice, it is usually advantageous to make multiple MOS devices each including a gate structure on the wafer 14 of FIG. 1 in a standard batch-fabrication procedure. In such a case, defects in the layer 12 could deleteriously affect the breakdown properties, and thus the performance, of the entire batch of devices. For this reason, it is common practice during fabrication to test one or more of the devices being made, or to evaluate test structures formed on the wafer between actual devices, as a basis for sampling the quality of the dielectric gate layer.

In accordance with the present invention, testing of the dielectric layer 12 of FIG. 1 is carried out by applying a test signal thereto. Illustratively, this is done by connecting a test signal generator 16 to the gate electrode 10 via an apparatus 18 which is described below. (Additionally, both the generator 16 and the bottom surface of the wafer 14 are connected to a point of reference potential such as ground.) The test signal can be a ramped current, a ramped voltage, a constant current applied until and subsequent to breakdown, a constant voltage applied until and subsequent to breakdown, or a momentarily applied voltage or current.

FIG. 1 further includes detecting apparatus 18 which is also connected to the gate electrode 10. Illustratively, the apparatus 18 comprises conventional signal detecting and processing equipment. In accordance with the invention, the apparatus 18 is adapted to measure the current or voltage noise signals that occur in the gate layer 12 while test signals are being applied thereto. As described in detail below, these noise signals have been found to be a decisive indicator of whether or not the layer 12 is in its pre-breakdown condition or actually broken down.

Prior to breakdown, Y- direction current flow (mainly tunneling current) through the layer 12 of FIG. 1 may be considered to occur in a substantially evenly distributed way through the cross-sectional extent of the layer via a multiplicity of parallel-disposed small-volume elements of the layer 12.

In practice, when breakdown occurs in the layer 12 of FIG. 1, a small-volume region of the layer assumes a relatively low-impedance condition. As a result, at breakdown substantially all the current flow through the layer is then limited to that small-volume region.

Especially for an ultra-thin dielectric layer, the increase in the absolute value of current flow through the layer that occurs at breakdown can be small or virtually non-existent relative to the value of pre-breakdown current. Accordingly, even though at breakdown the total current flow switches in effect from flowing through the volume of the layer to flowing through a small-volume region thereof, an external detector sensitive only to the absolute value of the total current flow may not be able easily, or at all, to detect the occurrence of the breakdown phenomenon.

In accordance with the principles of the present invention, fluctuations in (rather than the absolute value) of the current through or the voltage across the layer 12 of FIG. 1 are monitored. Even for an ultra-thin layer, these current or voltage fluctuations, which in effect constitute noise signals in the layer 12, have been found to be a reliable and easily detected indicator of whether the layer is in its pre-breakdown state or broken down. By this technique, accurate detection of breakdown in a dielectric layer, particularly in an ultra-thin layer, is significantly facilitated.

Conditions that produce noise signals are inevitably present in a dielectric material such as that of the layer 12 of FIG. 1. These conditions, which occur randomly throughout the volume of the layer both before and after breakdown, constitute dynamic events that vary with time, as is well known in the art.

Figure 2:
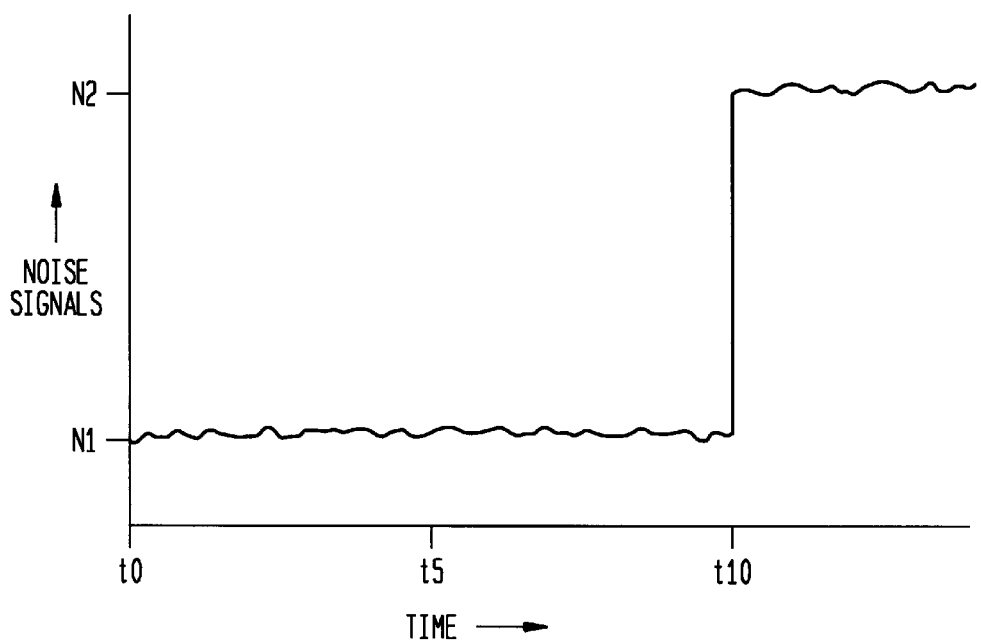
FIG. 2 is a graphical representation of the change in noise signal that is detected by the FIG. 1 apparatus to occur in the layer at breakdown.

For the purpose of a specific example, FIG. 2 graphically represents an illustrative case in which a constant-voltage test signal is applied over an extended period of time to a three-nm-thick layer 12 (FIG. 1) from the generator 16. In time, the layer breaks down, in a well known manner. In FIG. 2, breakdown is shown as occurring at time t10. In one particular example, t10 occurs about 4600 seconds after first applying a direct-current constant voltage of about five volts across the layer 12.

Illustratively, at multiple spaced-apart intervals along the time axis of FIG. 2, plural readings of the tunneling current flowing through the layer 12 of FIG. 1 are taken by the detecting apparatus 18. By way of example, a set of 128 such readings are periodically taken at eight-second intervals. The plural readings in each set are spaced apart, for example, by 0.0625 seconds. Thus, for the particular case in which t10 occurs at about 4600 seconds, a total of 575 sets of readings, each set including 128 measurements, would be taken.

Assume, for an illustrative example, that starting at time t5 of FIG. 2 during the pre-breakdown state of the layer 12, an intermediate one of the aforespecified sets of current readings is to be taken. Assume further that the set starting at t5 includes 128 such current readings each taken at eight-second intervals. These readings respectively constitute the absolute values of the currents that flow through the entire X-Z-plane cross-section of the layer 12 at these respective times.

In accordance with the invention, the set of 128 absolute values of the current flow measured at spaced intervals starting at t5 of FIG. 2 are processed in straightforward ways by the apparatus 18 of FIG. 1 to obtain a calculated value indicative of the fluctuations of the measured set of values. This calculated value is then in effect representative of the amplitude of the noise signal in the layer 12 during the measurement interval.

The aforementioned noise-representative signal may be derived from the measured absolute current values by any one of a number of standard techniques. Thus, for example, the noted current fluctuations may be calculated by obtaining the variance, the standard deviation or the Fourier transform of each set of current measurements. By way of a specific illustrative example, each set of current measurements will be assumed to be processed by the apparatus 18 of FIG. 1 to obtain the variance of the measured current values.

The standard procedure implemented by the apparatus 18 of FIG. 1 to calculate the variance of each set of current measurements involves initially determining the average of each set of measured absolute current values. Then, in the apparatus 18, each individual absolute-current measurement is subtracted from that average to obtain a difference value (which may be positive or negative). Subsequently, each difference is squared. Next, the squared differences are summed. The sum is then divided by the number of measurements. The resulting quantity constitutes the variance of the measurements.

Importantly, the value of each individual variance calculated as specified above is proportional to the current fluctuations or perturbations that occur in the layer 12 during each measurement interval. In effect, each variance value is thus representative of the amplitude of noise signals present in the layer during measurement.

The aforespecified individual variance values are plotted in FIG. 2. In the pre-breakdown period, in the time interval from t0 to t10, these values are in practice relatively small and approximately equal to each other. The slightly varying nature of the plot of such values in the interval t0-to-t10 is indicative of the fact that noise is a dynamic phenomenon and varies slightly from test interval to test interval as the multiple sets of current readings are being taken.

In the pre-breakdown period (t0-to-t10 in FIG. 2), randomly distributed and dynamically changing phenomena in the layer 12 of FIG. 1 may cause the relatively small current flowing through each small-volume element of the layer to be increased or decreased slightly from a nominal value of current. Thus, for each volume element, each of the measured currents will be equal to the nominal value, less than the nominal value, or greater than the nominal value. Overall, these current fluctuations in the multiple volume elements tend on average at any instant of time to substantially cancel each other out. Hence, the net total current fluctuation that is measured by the apparatus 18 as occurring in the volume of the layer 12 during each measurement interval in the pre-breakdown state tends to be significantly smaller than in the post-breakdown state. In FIG. 2, the nominal amplitude of these successively calculated small noise-representative signals is indicated on the Y axis by the designation N1.

At breakdown, at t10 in FIG. 2, substantially all of the current through the layer 12 of FIG. 1 flows through a limited-volume region thereof. As specified earlier above, for a three-nm-thick layer, breakdown typically occurs in a volume element whose X-Z-plane cross-sectional area has a small diameter. This large concentration of the total current flow in a limited volume of the layer 12 is the reason that the detected noise signal increases to a relatively large value (N2 in FIG. 2) at breakdown.

Any noise-producing perturbing phenomena that occur in the limited-volume region of the layer 12 at breakdown are not substantially averaged out in the way that multiple distributed fluctuations in effect cancel each other out in the volume of the overall layer before breakdown. Thus, at breakdown, the net effect of any perturbation in the small-volume region acting on substantially the totality of the current flowing through the layer is to produce an extremely large fluctuation in the total current flow therethrough. In practice, in one illustrative example, the amplitude of this fluctuation or noise-representative signal, indicated as N2 in FIG. 2, is, for example, about seven orders of magnitude greater than the corresponding signal calculated before breakdown.

Thus, in accordance with the principles of the present invention, a unique and simple way of accurately detecting breakdown in dielectric layers is provided. By taking advantage of the fact that the amplitude of noise signals in such a layer is inversely related to the cross-sectional area through which the current flows, the detection of the onset of breakdown, especially in ultra-thin layers, is significantly facilitated. Such detection can advantageously be utilized in combination with conventional breakdown-detection techniques.

Finally, it is to be understood that the above-described arrangements and techniques are only illustrative of the principles of the present invention. In accordance with these principles, numerous modifications and alternatives may be devised by those skilled in the art without departing from the spirit and scope of the invention. Thus, for example, although emphasis above was directed to an illustrative example utilizing variances, it is often advantageous to subtract a linear or smooth function from the measured value before calculating the variance. And even more thorough noise analysis can be performed employing conventional Fourier analysis. Also, the techniques described herein can be applied to individual dielectric layers made of a wide variety of materials (such as, for example, silicon nitride) or to multi-layer dielectric stacks. Further, the invention is applicable to testing dielectric layers included in an assortment of elements and devices other than MOS devices.

What is claimed is:

1. Apparatus for detecting the occurrence of electrical breakdown in a fixed-thickness dielectric layer, said apparatus comprising
   means for applying a test signal to said fixed-thickness layer,
   and means for detecting when the amplitude of noise signals in said layer during the application thereto of said test signal exceeds a prespecified value, thereby to indicate the occurrence of electrical breakdown in said fixed-thickness dielectric layer.

2. Apparatus as in claim 1 wherein said test signal comprises a ramped current signal.

3. Apparatus as in claim 1 wherein said test signal comprises a ramped voltage signal.

4. Apparatus as in claim 1 wherein said test signal comprises a constant-current signal applied to said layer until and subsequent to the occurrence of breakdown.

5. Apparatus as in claim 1 wherein said test signal comprises a constant-voltage signal applied to said layer until and subsequent to the occurrence of breakdown.

6. Apparatus as in claim 1 wherein said test signal comprises a signal that is momentarily applied to said layer.

7. Apparatus as in claim 1 wherein said means for detecting comprises means for taking successive sets of readings of the absolute values of the current flowing through said layer at spaced-apart intervals of time.

8. Apparatus as in claim 7 wherein said means for detecting further comprises means for calculating a noise-representative fluctuation from each set of current readings.

9. Apparatus as in claim 8 wherein said means for detecting still further comprises means for calculating the variance of each set of current readings.

10. Apparatus as in claim 9 wherein said means for calculating comprises subtracting a smooth function from said set of current readings before calculating the variance.

11. Apparatus as in claim 1 wherein said means for detecting comprises means for taking successive sets of readings of the absolute values of the voltage across said layer at spaced-apart intervals of time.

12. Apparatus as in claim 11 wherein said means for detecting further comprises means for calculating a noise-representative fluctuation from each set of voltage readings.

13. Apparatus as in claim 12 wherein said means for detecting still further comprises means for calculating the variance of each set of voltage readings.

14. Apparatus as in claim 13 wherein said means for calculating comprises subtracting a smooth function from said set of voltage readings before calculating the variance.

15. A method of detecting the occurrence of electrical breakdown in a fixed-thickness dielectric layer, said method comprising the steps of
   applying a test signal to said fixed-thickness layer,
   and detecting when the amplitude of the noise signal in said layer during the application of said test signal thereto increases beyond a prespecified value, thereby to indicate the occurrence of electrical breakdown in said fixed-thickness layer.

16. A method of testing a wafer that includes at least one test structure that contains a fixed-thickness dielectric layer, said method comprising the steps of
   applying a momentary test signal to said test structure,
   measuring the amplitude of the resulting noise signal generated in said test structure,
   and rejecting devices on said wafer if the noise signal exceeds a prespecified value which indicates that the fixed-thickness dielectric layer in said test structure has broken down.

17. A method as in claim 15 wherein said detecting step comprises taking successive sets of readings of the current through or the voltage across said layer at spaced-apart intervals of time.

18. A method as in claim 17 wherein said measuring step still further comprises calculating a noise-representative fluctuation from each set of readings.

19. A method as in claim 18 wherein the thickness of said layer is less than about six nm.

* * * * *